(12) United States Patent
Chen

(10) Patent No.: US 11,617,283 B2
(45) Date of Patent: Mar. 28, 2023

(54) HEAT DISSIPATING PLATE, MANUFACTURING METHOD THEREFOR AND ELECTRONIC DEVICE HAVING THE SAME

(71) Applicant: THERLECT CO., LTD., Taoyuan (TW)

(72) Inventor: Chien-Yu Chen, Taoyuan (TW)

(73) Assignee: THERLECT CO., LTD., Taoyuan (TW)

( * ) Notice: Subject to any disclaimer, the term of this patent is extended or adjusted under 35 U.S.C. 154(b) by 282 days.

(21) Appl. No.: 16/667,427

(22) Filed: Oct. 29, 2019

(65) Prior Publication Data
US 2021/0015003 A1 Jan. 14, 2021

(30) Foreign Application Priority Data
Jul. 10, 2019 (TW) ................................. 108124221

(51) Int. Cl.
*H05K 7/20* (2006.01)
*F28D 15/04* (2006.01)

(52) U.S. Cl.
CPC ......... *H05K 7/20336* (2013.01); *F28D 15/04* (2013.01)

(58) Field of Classification Search
CPC ............. F28D 2021/0089; F28D 15/04; F28D 15/0233; F28D 15/046; F28D 15/0283;
(Continued)

(56) References Cited

U.S. PATENT DOCUMENTS 3,746,081 A * 7/1973 Corman ................ F28D 15/046
165/272
4,322,737 A * 3/1982 Sliwa, Jr. ............ H01L 31/0521
257/719
(Continued)

FOREIGN PATENT DOCUMENTS

| CN | 104121797 A | * | 10/2014 | |
| CN | 110475457 B | * | 6/2021 | |
| JP | 2002062068 A | * | 2/2002 | ........... F28D 15/046 |

OTHER PUBLICATIONS

Rao et al., Uniform Vacuum sealing structure and manufacturing method thereof, Oct. 29, 2014, PE2E search english translation, CN104121797 (Year: 2014).*
(Continued)

*Primary Examiner* — Michael A Matey
(74) *Attorney, Agent, or Firm* — WPAT, PC

(57) ABSTRACT

A heat dissipating plate includes a casing, a capillary structure layer, a support structure, and heat dissipating liquid. The casing includes a first substrate and a second substrate, which is disposed opposite to the first substrate to form a non-vacuum sealed cavity. The capillary structure layer is disposed in a first region of the non-vacuum sealed cavity and defines a first flow space. The support structure is disposed in a second region of the non-vacuum sealed cavity and defines a second flow space. The heat dissipating liquid is disposed in the non-vacuum sealed cavity, the liquid amount of which is more than 50% of the total capacity of the first flow space and the second flow space, and flows between the first flow space and the second flow space. The invention also provides a method for manufacturing the heat dissipation plate and an electronic device having the heat dissipation plate.

14 Claims, 8 Drawing Sheets

(58) Field of Classification Search
CPC .......... F28D 2020/0008; F28D 9/0031; H05K 7/20336; H05K 7/20254; H01L 21/4882; H01L 21/4871; F28F 3/12; F28F 2280/00; F28F 2230/00; F28F 9/001; F28F 9/002; F28F 9/005; F28F 9/0075; F28F 2275/025; B23P 15/26; B23P 2700/09; B23K 2101/14
See application file for complete search history.

(56) References Cited

U.S. PATENT DOCUMENTS

| | | | | |
|---|---|---|---|---|
| 8,763,408 | B2* | 7/2014 | Ma | F28D 15/043 62/3.2 |
| 2002/0062648 | A1* | 5/2002 | Ghoshal | F28D 15/0233 62/3.7 |
| 2002/0139516 | A1* | 10/2002 | Zuo | F28D 15/0233 165/104.26 |
| 2003/0136551 | A1* | 7/2003 | Bakke | F28D 15/0233 165/104.26 |
| 2004/0244397 | A1* | 12/2004 | Kim | G06F 1/203 62/259.2 |
| 2006/0157227 | A1* | 7/2006 | Choi | F28D 15/0233 165/104.21 |
| 2007/0258213 | A1* | 11/2007 | Chen | F28D 15/0233 361/701 |
| 2010/0265709 | A1* | 10/2010 | Liu | F21V 29/763 362/249.02 |
| 2012/0018130 | A1* | 1/2012 | Chang | F28D 15/0266 165/104.21 |
| 2013/0088818 | A1* | 4/2013 | Yamaguchi | H05K 5/06 361/679.01 |
| 2014/0246176 | A1* | 9/2014 | Yang | F28D 15/0266 165/104.26 |
| 2015/0083372 | A1* | 3/2015 | Yang | F28D 15/04 165/104.26 |
| 2015/0181764 | A1* | 6/2015 | Honmura | H01L 23/427 165/104.21 |
| 2016/0288276 | A1* | 10/2016 | Chen | F28D 15/04 |
| 2016/0309619 | A1* | 10/2016 | Tsai | F28F 3/12 |
| 2018/0120912 | A1* | 5/2018 | Jenkins | B33Y 10/00 |
| 2018/0320984 | A1* | 11/2018 | Lewis | F28D 15/0233 |
| 2018/0372424 | A1* | 12/2018 | Hurbi | F28D 20/025 |
| 2019/0021188 | A1* | 1/2019 | Phan | H05K 7/20336 |
| 2019/0041143 | A1* | 2/2019 | MacDonald | F28F 9/22 |
| 2020/0003498 | A1* | 1/2020 | Tseng | F28D 15/0233 |
| 2020/0091036 | A1* | 3/2020 | Chen | H01L 23/427 |
| 2020/0309470 | A1* | 10/2020 | Huang | F28D 15/0283 |
| 2021/0095930 | A1* | 4/2021 | Inagaki | F28D 15/0233 |

OTHER PUBLICATIONS

Zhang, Yu-wei, Radiating structure and electronic device with the radiating structure, Jun. 29, 2021, PE2E search english translation, CN110475457 (Year: 2021).*

Mochizuki et al., Flat plate type heat pipe. Feb. 28, 2002, Espacenet english translation, JP2002062068 (Year: 2002).*

* cited by examiner

HEAT DISSIPATING PLATE, MANUFACTURING METHOD THEREFOR AND ELECTRONIC DEVICE HAVING THE SAME

RELATED APPLICATIONS

The present application claims priority to Taiwanese Application Number 108124221, filed Jul. 10, 2019, the disclosure of which is hereby incorporated by reference herein in its entirety.

BACKGROUND

1. Field of the Disclosure

This disclosure generally relates to a heat dissipating structure and, more particularly, to a heat dissipating plate, a manufacturing method for the heat dissipating plate and an electronic device having the heat dissipating plate.

2. Description of the Related Art

As the performance of portable electronic devices increases, heat generated by components of the portable electronic devices, such as data processors, graphics processors and communication chips, increases accordingly. One trend of portable electronic devices is reducing their weight and size. Therefore, it is very important to design a heat dissipating structure for portable electronic devices with more effective heat dissipation and smaller and lighter form factor.

Vapor chamber is a common heat dissipation structure in portable electronic devices. A vapor chamber has an internal vacuum cavity. Inside the internal vacuum cavity there are a capillary structure layer and heat dissipating liquid (for example, pure water) less than 10% of the total capacity of the internal vacuum cavity. The heat dissipating liquid is absorbed in the capillary structure layer to limit its flow characteristics. The heat dissipating liquid vaporizes to heat dissipating gas after absorbing heat and fill the cavity through built-in vapor channels to begin repeated cycles of vaporization and condensation to achieve the purposes of thermal conduction and thermal diffusion. In addition, such a vapor chamber requires a vacuuming equipment to vacuum the cavity to reduce the boiling point of the heat dissipating liquid and enable the heat dissipating gas to pass through the vapor channels rapidly. However, the vacuuming process increases manufacturing time and manufacturing cost. Furthermore, the heat dissipation of a vapor chamber is achieved by the flowing of the heat dissipating gas, whose heat dissipating efficiency is limited and lower than that of liquid cooling.

SUMMARY

The present disclosure is related to a heat dissipating plate that is light, thin and able to dissipate heat effectively. The heat dissipating plate achieves small form factor and effective heat dissipation by controlling non-vacuum characteristics of the sealed cavity, the liquid amount of the heat dissipating liquid, and the configuration of the capillary structure layer and the support structure.

The present disclosure provides a heat dissipating plate including a casing, a capillary structure layer, at least one support structure, and a heat dissipating liquid. The casing includes a first substrate and a second substrate, wherein the first substrate and the second substrate are disposed opposite to each other to form a non-vacuum sealed cavity, wherein the non-vacuum sealed cavity defines a first region and a second region. The capillary structure layer is disposed in the first region and defines a first flow space in the first region. The at least one support structure is disposed in the second region and provides support between the first substrate and the second substrate, wherein the at least one support structure defines a second flow space in the second region. The heat dissipating liquid is disposed in the non-vacuum sealed cavity and configured to flow between the first flow space and the second flow space. The liquid amount of the heat dissipating liquid is more than 50% of a total capacity of the first flow space and the second flow space. At least a part of the heat dissipating liquid in the first flow space is configured to vaporize into a heat dissipating gas after absorbing heat. The heat dissipating gas is configured to diffuse from an end of the first flow space into the second flow space, and, after contacting with the heat dissipating liquid in the second flow space, condense and join the heat dissipating liquid in the second flow space. The heat dissipating liquid after the condensing and the joining is configured to flow in the second flow space and flow back into the first flow space through another end of the first flow space.

The present disclosure is further related to an electronic device including the heat dissipating plate and a method for manufacturing the heat dissipating plate.

The present disclosure provides an electronic device including the heat dissipating plate, a circuit board, and an electronic component disposed on the circuit board. The heat dissipating plate is disposed on the circuit board to dissipate the heat generated by the operation of the electronic component.

The present disclosure provides a method for manufacturing a heat dissipating plate, including: providing a first substrate and a second substrate, wherein the first substrate has a through hole, wherein a first region and a second region are defined on the second substrate; disposing a capillary structure layer on the first region; disposing at least one support structure on the second region; disposing a sealing glue layer on the second substrate, wherein the sealing glue layer surrounds the first region and the second region; attaching the first substrate to the second substrate through the sealing glue layer so that the first substrate is positioned over the second substrate to form a cavity between the first substrate and the second substrate, the capillary structure layer defines a first flow space in the first region, and the at least one support structure defines a second flow space in the second region; injecting a heat dissipating liquid into the cavity through the through hole, wherein a liquid amount of the heat dissipating liquid injected into the cavity is more than 50% of a total capacity of the first flow space and the second flow space; heating the first substrate or the second substrate for a predetermined time duration to drive a part of air in the cavity from the cavity through the through hole; and sealing the through hole to convert the cavity into a non-vacuum sealed cavity.

The sealed cavity of the heat dissipating plate manufactured by the aforementioned method is not vacuum, which requires neither vacuuming equipment nor soldering an additional liquid injection pipe to the through hole. Therefore, the aforementioned method can reduce the time and cost for manufacturing the heat dissipating plate.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts. The separate embodiments in the present disclosure below may be combined together to achieve superimposed functions.

A heat dissipating plate, a method for manufacturing the heat dissipating plate, and an electronic device including the heat dissipating plate according to various embodiments of the present disclosure are discussed below. However, the embodiments of the present disclosure are merely examples describing the heat dissipating plate and the method for manufacturing the heat dissipating plate provided by the present disclosure. The embodiments of the present disclosure have no purpose to limit the scope of the present disclosure.

Figure 1:
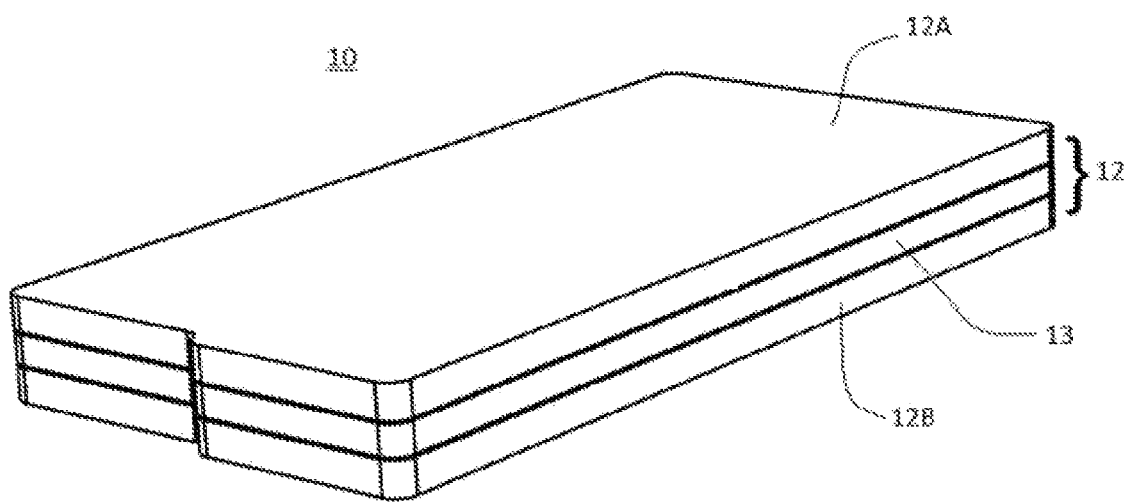
FIG. 1 is a schematic diagram of a heat dissipating plate according to an embodiment of the present disclosure.
Figure 2:
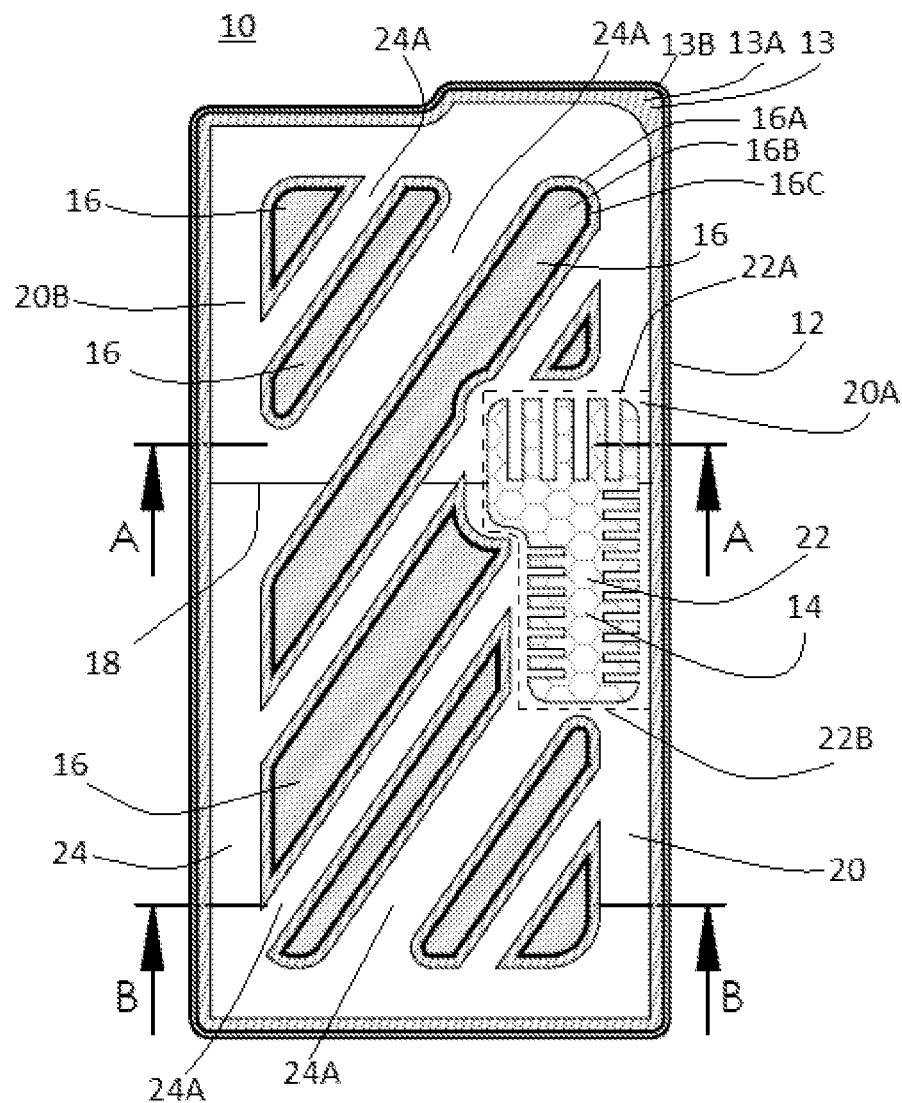
FIG. 2 is a schematic diagram showing the internal structure of the heat dissipating plate in FIG. 1.
Figure 3A:
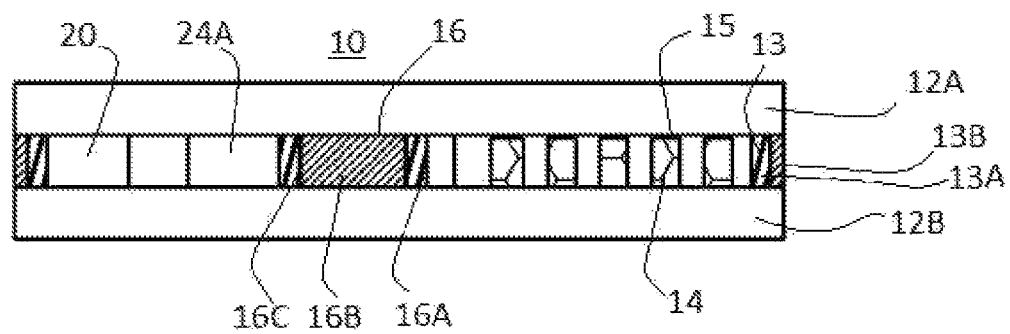
FIG. 3A is a cross-sectional view of the heat dissipating plate in FIG. 2 along the line segment A-A.
Figure 3B:
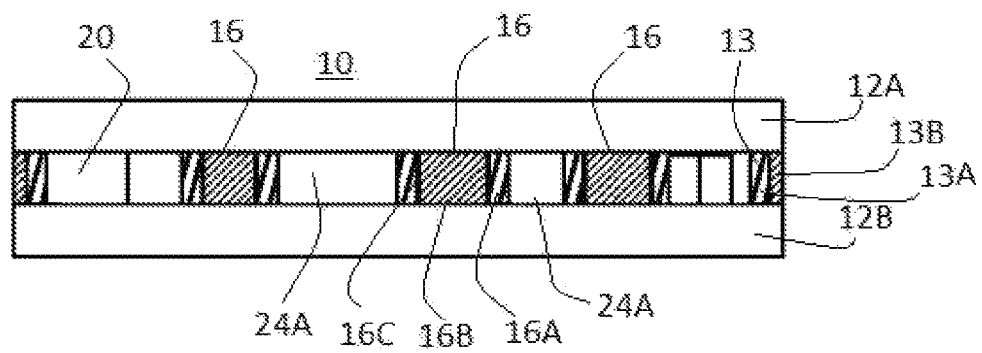
FIG. 3B is a cross-sectional view of the heat dissipating plate in FIG. 2 along the line segment B-B.

FIG. 1 is a schematic diagram of a heat dissipating plate 10 according to an embodiment of the present disclosure. FIG. 2 is a schematic diagram showing the internal structure of the heat dissipating plate 10 in FIG. 1. FIG. 3A is a cross-sectional view of the heat dissipating plate 10 in FIG. 2 along the line segment A-A. FIG. 3B is a cross-sectional view of the heat dissipating plate 10 in FIG. 2 along the line segment B-B. Please refer to FIGS. 1, 2, 3A and 3B. The heat dissipating plate 10 includes a casing 12, a sealing glue layer 13, a capillary structure layer 14, a plurality of support structures 16, and a heat dissipating liquid 18. The thickness of the casing 12 can be thinner than 1 mm. The casing 12 includes a first substrate 12A and a second substrate 12B. The first substrate 12A and the second substrate are 12B are disposed substantially parallel and opposite to each other to form a non-vacuum sealed cavity 20. The first substrate 12A and the second substrate 12B are made of flexible metal material. The non-vacuum sealed cavity 20 defines a first region 20A and a second region 20B. The sealing glue layer 13 connects the first substrate 12A and the second substrate 12B. The sealing glue layer 13 surrounds the first region 20A and the second region 20B to form the non-vacuum sealed cavity 20. The capillary structure layer 14 is disposed in the first region 20A and defines a first flow space 22 in the first region 20A. In an embodiment, the capillary structure layer 14 is made of porous material. At least one glue layer 15 attaches the capillary structure layer 14 to both the first substrate 12A and the second substrate 12B (as shown in FIG. 3A) or one of the first substrate 12A and the second substrate 12B. The multiple inter-connected pores in the porous material define the first flow space 22. The support structures 16 are disposed in the second region 20B and defines a second flow space 24 in the second region 20B. The support structures 16 connect the first substrate 12A and the second substrate 12B. In addition, the support structures 16 provides support between the first substrate 12A and the second substrate 12B to form a gap between the first substrate 12A and the second substrate 12B. In the present embodiment, the support structures 16 are support strips spaced apart from each other and disposed in the second region 20B to define a plurality of flow channels 24A between the sealing glue layer 13 and the support structures 16. The flow channels 24A constitute the second flow space 24. In another embodiment, the flow channels 24A can be defined by the support structures 16 with other shapes together with the sealing glue layer 13. In an embodiment, the heat dissipating liquid 18 is an insulating liquid with a boiling point lower than 50 degrees Celsius so that the heat dissipating liquid 18 is not harmful to electric components. The heat dissipating liquid 18 is disposed in the non-vacuum sealed cavity 20 for flowing between the first flow space 22 and the second flow space 24. The liquid amount of the heat dissipating liquid 18 is more than 50% of the total capacity of the first flow space 22 and the second flow space 24, as shown in FIG. 2. In the present embodiment, the total capacity of the first flow space 22 and the second flow space 24 is the capacity of the non-vacuum sealed cavity 20 that can be filled with the heat dissipating liquid 18.

Please refer to FIGS. 3A and 3B. In an embodiment, the sealing glue layer 13 is constituted by a circular glue layer 13A and a waterproof glue layer 13B, and each support structure 16 is constituted by a strip glue layer 16A and a waterproof glue layer 16B. The strip glue layer 16A is a double-sided glue layer having an opening 16C. The strip glue layer 16A is connected between the first substrate 12A and the second substrate 12B. The circular glue layer 13A and the strip glue layer 16A can be double-sided glue layers made using the same material and the same process (more details later). During the manufacturing of the heat dissipating plate 10, the opening 16C receives the waterproof glue layer 16B to fixate the position of the waterproof glue layer 16B and prevent the waterproof glue layer 16B from being squeezed and flowing outward to reduce or block the flow channels 24A when the first substrate 12A and the second substrate 12B are assembled together. In another embodiment, each support structure 16 can be formed by a waterproof glue layer 16B alone without the fixation by the opening 16C of the strip glue layer 16A when the glue of the waterproof glue layer 16B is stable enough and not prone to free flow.

In an embodiment, the sealing glue layer 13 can be formed by a waterproof glue layer 13B alone when the glue of the waterproof glue layer 13B is stable enough and not prone to free flow. The sealing glue layer 13 and the waterproof glue layer 16B of the support structure 16 can be made using the same material and the same process (more details later).

The heat dissipating plate 10 is in a standing still state in FIG. 2. Therefore, due to gravity, all of the heat dissipating liquid 18 flows to the lower part of the non-vacuum sealed cavity 20, and there is no bubble under the liquid surface of the heat dissipating liquid 18. The level surface indicated by the number 18 in FIG. 2 is the liquid surface of the heat dissipating liquid 18 when the heat dissipating liquid 18 is still.

Figure 4:
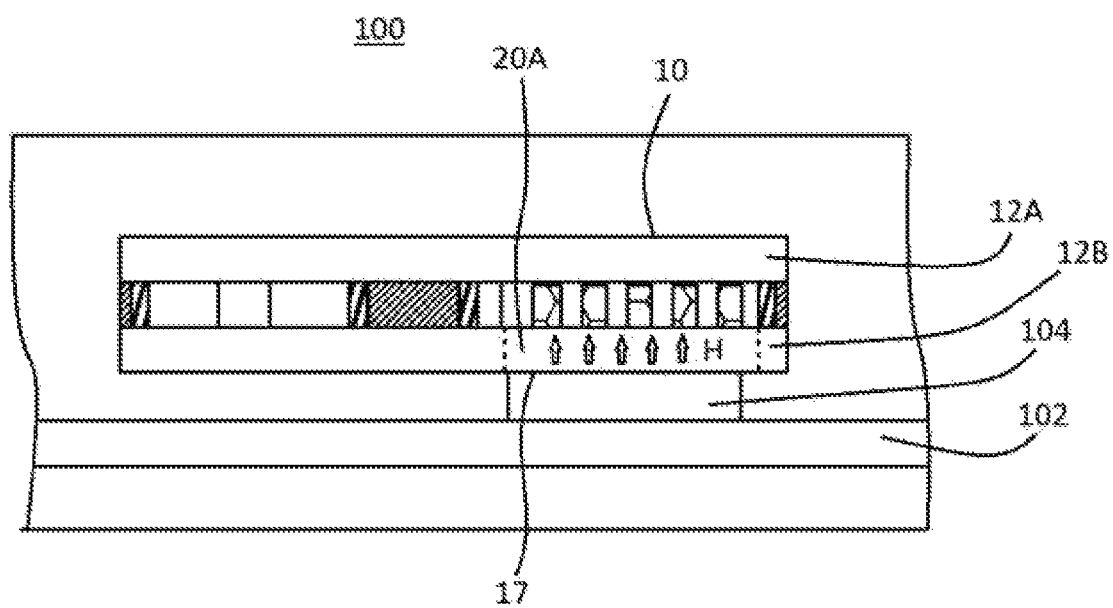
FIG. 4 is a partial cross-sectional view of an electronic device according to an embodiment of the present disclosure.

FIG. 4 is a partial cross-sectional view of an electronic device 100 according to an embodiment of the present disclosure. The electronic device 100 includes a heat dissipating plate 10, a circuit board 102, and an electronic component 104. The electronic component 104 is disposed on the circuit board 102 and generates heat during operation. The electronic component 104 is a general processor, a graphics processor, a communication chip, or any other electronic component that generates heat. The heat dissipating plate 10 is the same as its counterpart shown in FIGS. 1, 2 and 3A. The heat dissipating plate 10 is disposed on the circuit board 102. The outer surface 17 of the second substrate 12B corresponding to the first region 20A of the non-vacuum sealed cavity 20 is aligned to and in contact with the electronic component 104.

Figure 5:
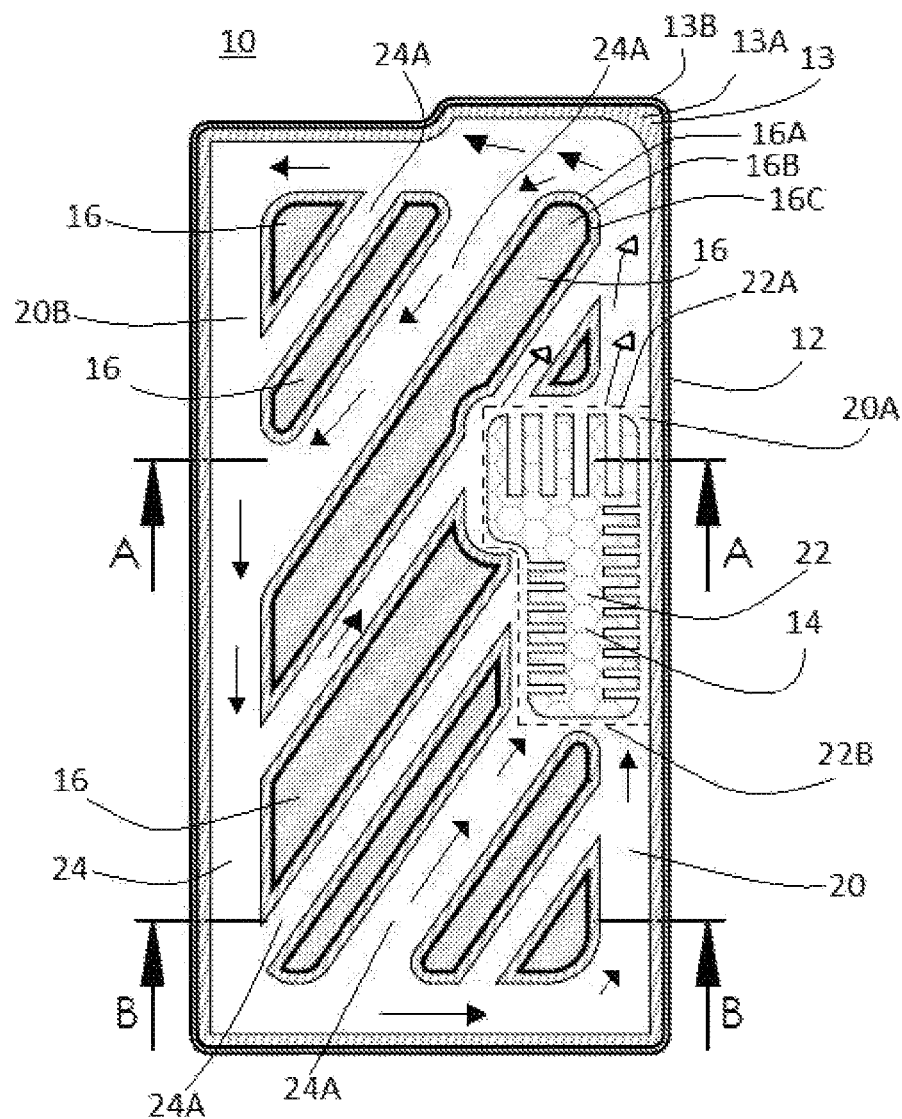
FIG. 5 is a schematic diagram showing the internal structure of the electronic device in FIG. 4 with the heat dissipating plate in FIG. 1 for absorbing heat.

FIG. 5 is a schematic diagram showing the internal structure of the electronic device 100 in FIG. 4 with the heat dissipating plate 10 in FIG. 1 for absorbing heat. Please refer to FIGS. 4 and 5. When the electronic component 104 generates heat H during operation, the heat H diffuse toward the outer surface 17 and enters the first region 20A through the second substrate 12B. Next, when the heat H is higher than the boiling point of the heat dissipating liquid 18 (for example, 50 degrees Celsius), at least a part of the heat dissipating liquid 18 in the first flow space 22 absorbs the heat H and vaporizes from heat dissipating liquid into heat dissipating gas, and generates higher steam pressure. The heat dissipating gas diffuses from an end 22A of the first flow space 22 into the second flow space 24 with a lower temperature (the directions of the diffusion are shown as hollow-headed arrows in FIG. 5), and, after contacting with the heat dissipating liquid 18 in the second flow space 24, the heat dissipating gas condenses and joins the heat dissipating liquid 18 in the second flow space 24, thereby dissipating the heat. Next, the heat dissipating liquid after the condensing and the joining flows in the second flow space 24 (the directions of the flowing are shown as solid-headed arrows in FIG. 5), thereby carrying the residual heat away from the heat source and releasing the heat through thermal exchange with the external environment to achieve the purpose of heat dissipation. Next, driven by the attraction force generated by the capillary effect of the capillary structure layer 14 and the vacancy caused by the spreading of the heat dissipating gas in the first flow space 22, the heat dissipating liquid after the condensing and the joining flows back into the first flow space 22 through another end 22B of the first flow space 22. Next, the aforementioned heat dissipating liquid flows into the region absorbing the heat H, vaporizes from heat dissipating liquid to heat dissipating gas, and repeats the aforementioned cycle of thermal exchange. In the present embodiment, the volume of the heat dissipating liquid in the second flow space 24 is larger than the volume of the heat dissipating gas.

Compared to conventional vapor chambers, the cavity in the heat dissipating plate 10 in the previous embodiments is not vacuum, and the liquid amount of the heat dissipating liquid 18 is more than 50% of the total capacity of the first flow space 22 and the second flow space 24. When the heat dissipating liquid 18 absorbs the heat H, only a small part of the heat dissipating liquid 18 vaporizes into gas, while most of the heat dissipating liquid 18 remains in liquid state. Therefore, the thermal exchange cycles in the previous embodiments is achieved by the circulation of the heat dissipating liquid after the condensing and the joining between the first flow space 22 and the second flow space 24. The aforementioned circulation of the heat dissipating liquid after the condensing and the joining in the thermal exchange cycles is propelled by a combined force. The combined force includes (1) the gas pressure generated when the heat dissipating liquid 18 vaporizes into the heat dissipating gas after absorbing heat, (2) the surface tension of the first substrate 12A and the second substrate 12B, (3) the attraction force generated by the capillary effect of the capillary structure layer 14, and (4) the gravity.

Figure 6:
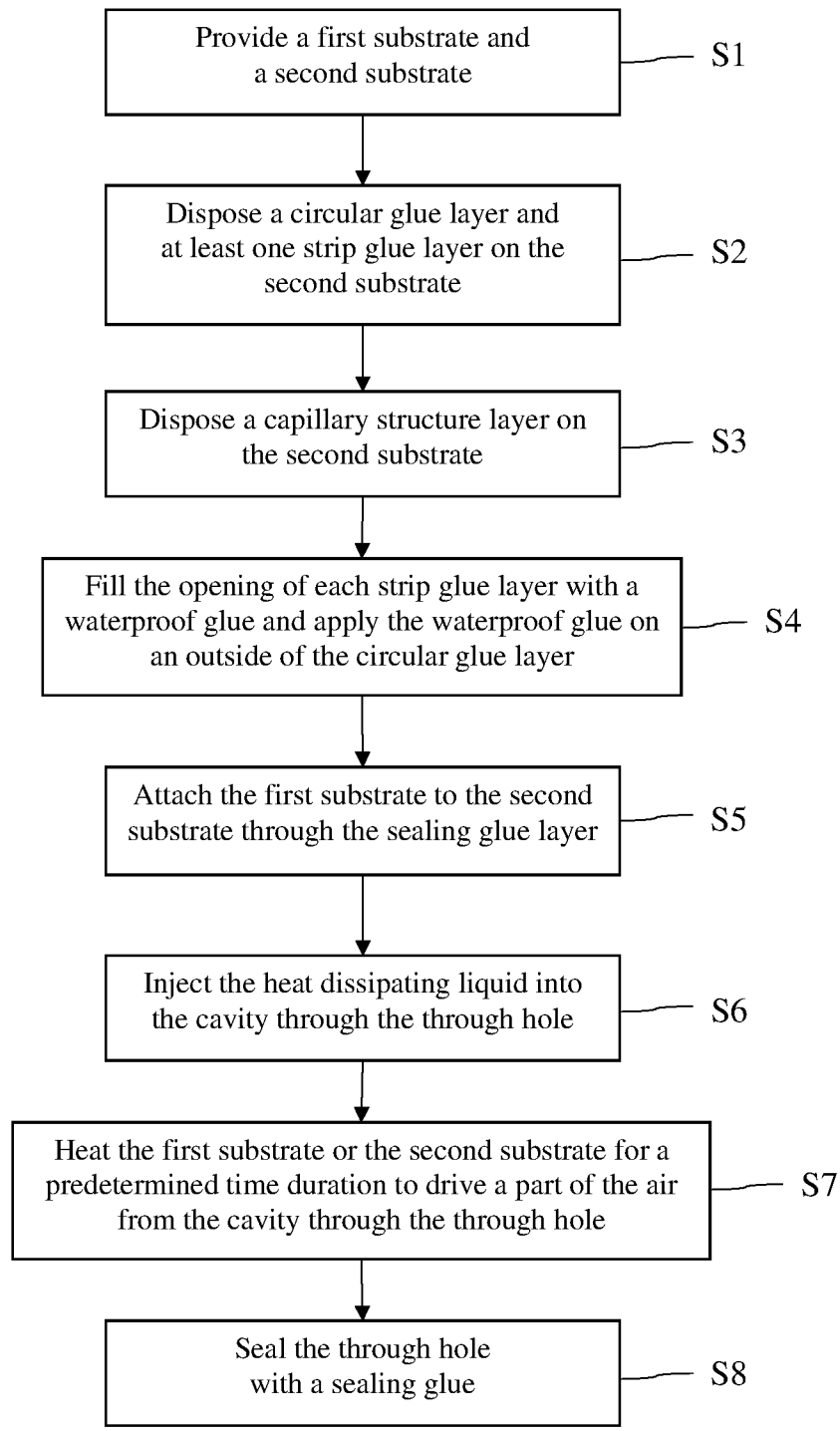
FIG. 6 is a flow chart of a method for manufacturing a heat dissipating plate according to an embodiment of the present disclosure.

FIG. 6 is a flow chart of a method for manufacturing the heat dissipating plate 10 according to an embodiment of the present disclosure. FIGS. 7A to 7H are cross-sectional views illustrating a process for manufacturing the heat dissipating plate 10 in FIG. 1. Please refer to FIGS. 6 and 7A-7H. The process for manufacturing the heat dissipating plate 10 in FIG. 1 is described in details below.

Figure 7A:
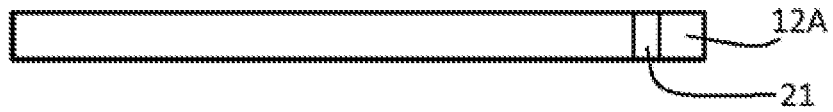
FIGS. 7A to 7H are cross-sectional views illustrating a process for manufacturing the heat dissipating plate in FIG. 1.
Figure 7A:
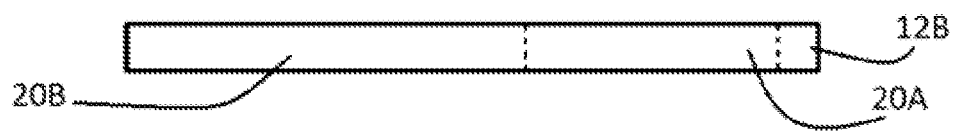

Step S1: First, provide a first substrate 12A and a second substrate 12B. The first substrate 12A has a through hole 21. A first region 20A and a second region 20B are defined on the second substrate 12B, as shown in FIG. 7A.

Figure 7B:
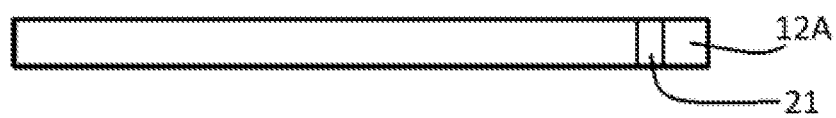
Figure 7B:
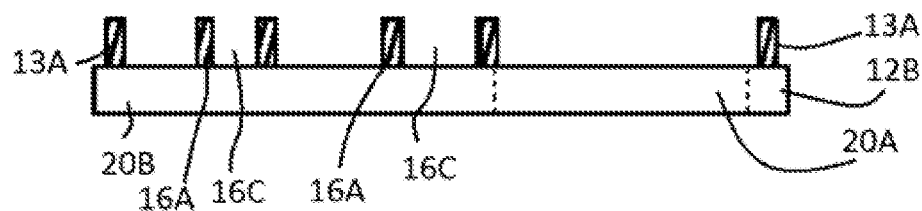

Step S2: Dispose a circular glue layer 13A on a peripheral region of the second region 20B, and dispose at least one strip glue layer 16A on the second region 20B. Each strip glue layer 16A has an opening 16C, as shown in FIG. 7B.

Figure 7C:
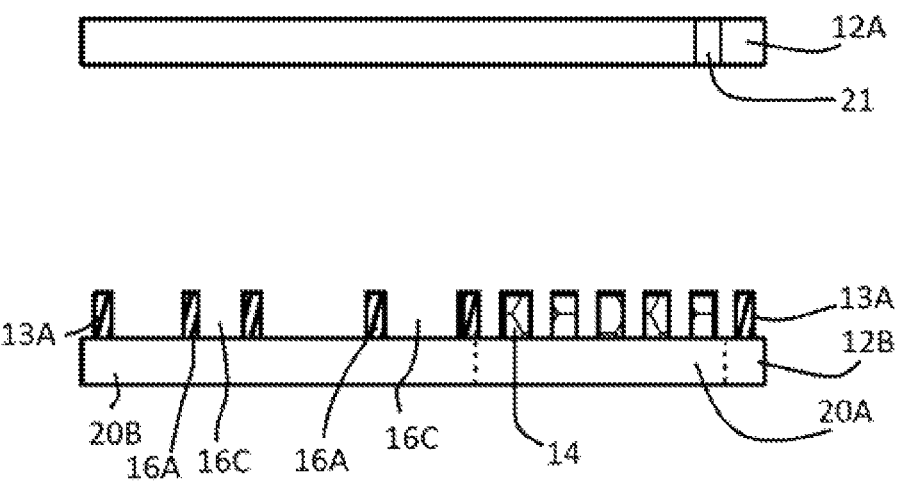

Step S3: Dispose a capillary structure layer 14 on the first region 20A of the second substrate 12B, as shown in FIG. 7C. In an embodiment, the capillary structure layer 14 can be attached to the first region 20A of the second substrate 12B by a glue layer. In another embodiment, the execution order of the steps S2 and S3 can be adjusted according to the actual arrangement of the manufacturing equipment. For example, execute step S3 to dispose the capillary structure layer 14 on the first region 20A and then execute step S2 to dispose the circular glue layer 13A and the strip glue layer 16A.

Figure 7D:
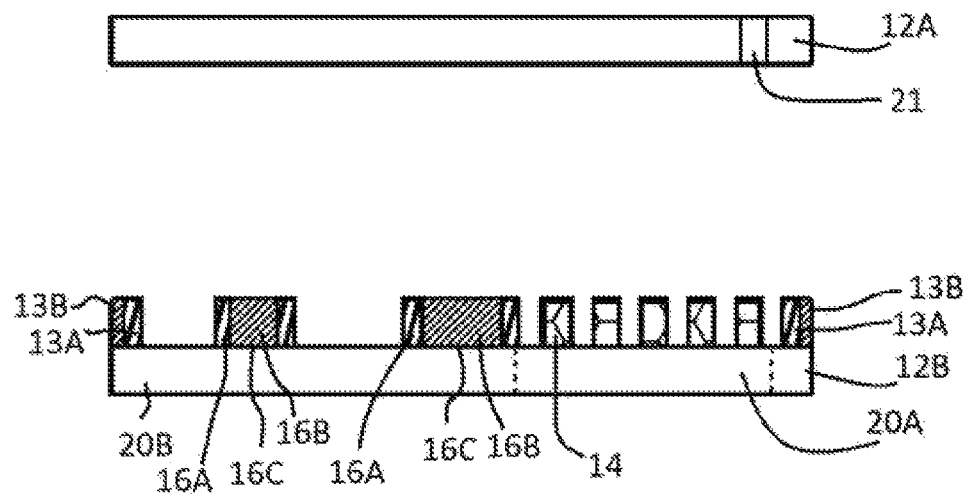

Step S4: Fill the opening 16C of each strip glue layer 16A with a waterproof glue by a glue dispenser (not shown in the figures) to form a waterproof glue layer 16B in order to form and dispose the at least one support structure 16 on the second region 20B. Meanwhile, apply the waterproof glue on an outside of the circular glue layer 13A by a glue dispenser to form a waterproof glue layer 13B in order to form and dispose the sealing glue layer 13 on the second substrate 12B. The sealing glue layer 13 surrounds the first region 20A and the second region 20B, as shown in FIG. 7D.

Figure 7E:
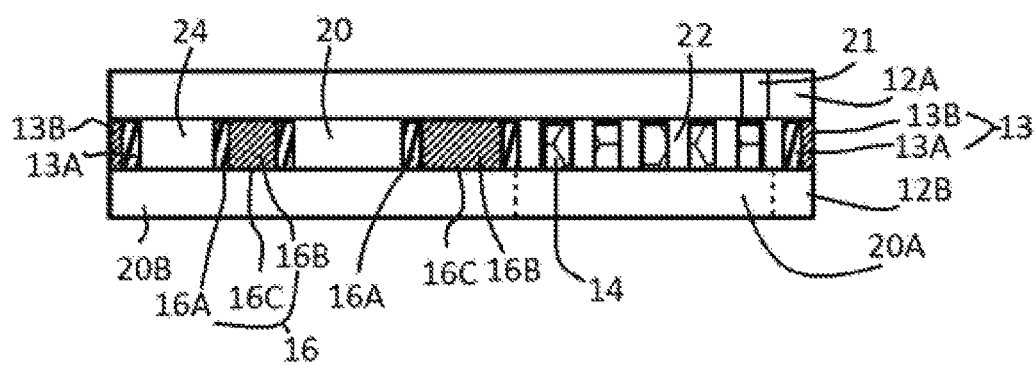

Step S5: Attach the first substrate 12A to the second substrate 12B through the sealing glue layer 13 so that the first substrate 12A is positioned over the second substrate 12B to form a cavity 20 between the first substrate 12A and the second substrate 12B so that the capillary structure layer 14 defines a first flow space 22 in the first region 20A and the at least one support structure 16 defines a second flow space 24 in the second region 20B, as shown in FIG. 7E. In an embodiment, the first substrate 12A and the second substrate 12B can be connected to each other by the strip glue layer 16A and the waterproof glue layer 16B of the at least one support structure 16.

Figure 7F:
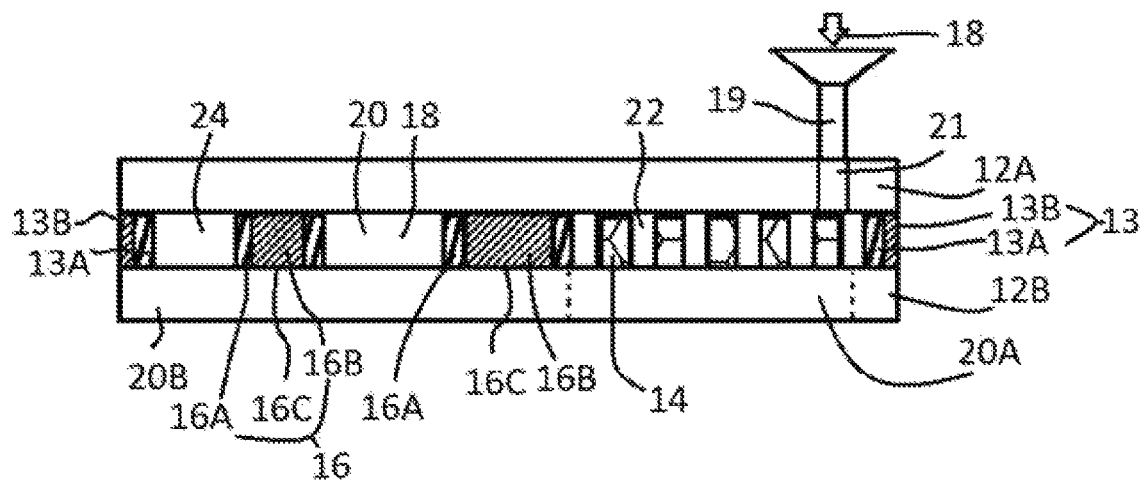

Step S6: Inject the heat dissipating liquid 18 into the cavity 20 through the through hole 21 by a needle 19 of a liquid injection machine. The liquid amount of the heat dissipating liquid 18 injected into the cavity 20 is more than 50% of the total capacity of the first flow space 22 and the second flow space 24, as shown in FIG. 7F. In another embodiment, the through hole 21 can be fabricated at any position that can communicate with the cavity 20 on the first substrate 12A or the second substrate 12B for injecting the heat dissipating liquid 18 into the cavity 20.

Figure 7G:
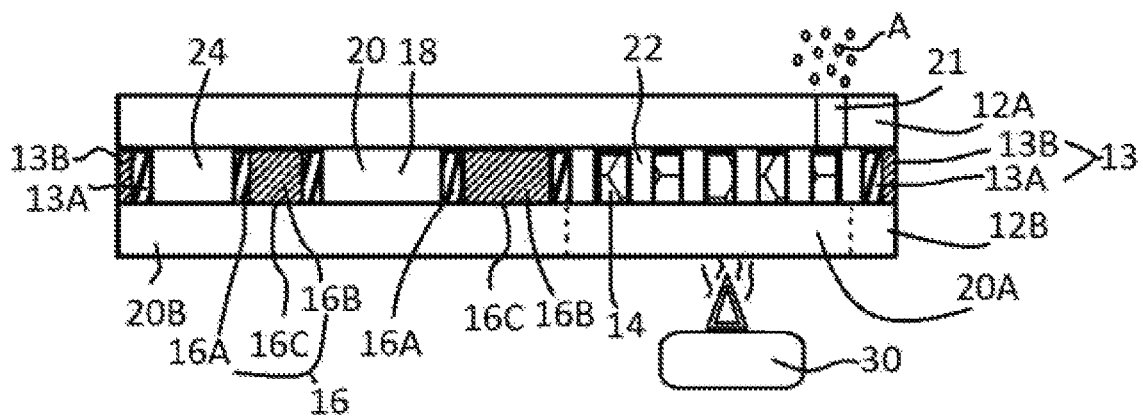

Step S7: Remove the needle 19 from the through hole 21 and heat the first substrate 12A or the second substrate 12B using a heating machine 30 for a predetermined time duration to drive a part of the air A in the cavity 20 from the cavity 20 through the through hole 21, and keep another part of the air in the cavity 20, as shown in FIG. 7G.

Figure 7H:
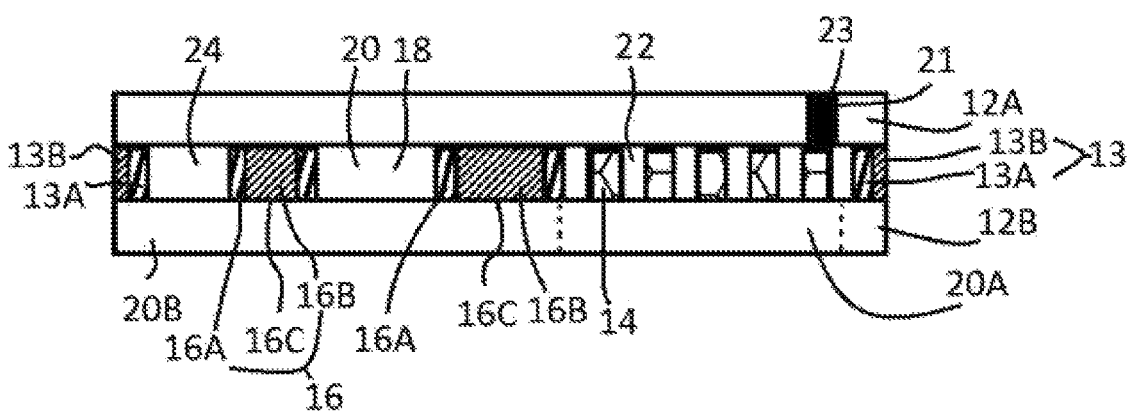

Step S8: Seal the through hole 21 with a sealing glue 23 to convert the cavity 20 into a non-vacuum sealed cavity 20, as shown in FIG. 7H.

The heat dissipating plate 10 provided by the present disclosure requires neither vacuuming equipment nor soldering an additional liquid injection pipe to the through hole 21. Therefore, the time and cost for manufacturing the heat dissipating plate can be reduced. In addition, the liquid amount of the heat dissipating liquid 18 in the cavity 20 of the heat dissipating plate 10 is more than 50% of the total capacity of the first flow space 22 and the second flow space 24, which enables more effective thermal exchange for rapid heat dissipation.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A heat dissipating plate, comprising:
   a casing, comprising a first substrate and a second substrate, wherein the first substrate and the second substrate are disposed opposite to each other to form a non-vacuum sealed cavity, wherein the non-vacuum sealed cavity has a first region and a second region defined therein;
   a capillary structure layer, disposed in the first region and defining a first flow space in the first region;
   a plurality of support structures, disposed in the second region to define a plurality of flow channels and providing support between the first substrate and the second substrate, wherein the plurality of flow channels constitutes a second flow space in the second region; and
   a heat dissipating liquid, disposed in the non-vacuum sealed cavity and configured to flow between the first flow space and the second flow space in the non-vacuum sealed cavity, wherein:
   the liquid amount of the heat dissipating liquid is more than 50% of a total capacity of the first flow space and the second flow space,
   at least a part of the heat dissipating liquid in the first flow space is configured to vaporize into a heat dissipating gas after absorbing heat,
   the heat dissipating gas is configured to diffuse from an end of the first flow space into the second flow space in the non-vacuum sealed cavity, and, after contacting with the heat dissipating liquid in the second flow space, condense and join the heat dissipating liquid in the second flow space in the non-vacuum sealed cavity, and
   the heat dissipating liquid after the condensing and the joining is configured to flow in the second flow space and flow back into the first flow space through another end of the first flow space;
   wherein the at least one support structure includes a strip glue layer and a waterproof glue layer, the strip glue layer is a double-sided glue layer connected between the first substrate and the second substrate and having an opening, and the opening receives the waterproof glue layer to fixate a position of the waterproof glue layer.

2. The heat dissipating plate of claim 1, wherein a thickness of the casing is thinner than 1 mm, wherein the first substrate and the second substrate are disposed substantially parallel and opposite to each other, wherein the first substrate and the second substrate are made of flexible metal material.

3. The heat dissipating plate of claim 1, wherein the flowing of the heat dissipating liquid after the condensing and the joining is propelled by a combined force, wherein the combined force comprises a gas pressure generated when the heat dissipating liquid vaporizes into the heat dissipating gas after absorbing heat, a surface tension of the first substrate and the second substrate, an attraction force generated by a capillary effect of the capillary structure layer, and a gravity.

4. The heat dissipating plate of claim 1, wherein a volume of the heat dissipating liquid in the second flow space is larger than a volume of the heat dissipating gas, wherein the heat dissipating liquid is an insulating liquid with a boiling point lower than 50 degrees Celsius.

5. The heat dissipating plate of claim 1, further comprising a sealing glue layer, wherein the sealing glue layer connects the first substrate and the second substrate and surrounds the first region and the second region to form the non-vacuum sealed cavity.

6. The heat dissipating plate of claim 5, wherein the total capacity of the first flow space and the second flow space is a capacity of the non-vacuum sealed cavity that can be filled with the heat dissipating liquid.

7. The heat dissipating plate of claim 1, wherein the capillary structure layer is made of porous material, wherein at least one glue layer attaches the capillary structure layer to at least one of the first substrate and the second substrate.

8. The heat dissipating plate of claim 1, wherein the at least one support structure comprises a plurality of support strips spaced apart from each other and disposed in the second region to define the plurality of flow channels.

9. An electronic device, comprising:
   a circuit board;
   an electronic component disposed on the circuit board; and
   a heat dissipating plate having a surface in contact with the electronic component;
   wherein the heat dissipating plate comprises:
      a casing, comprising a first substrate and a second substrate, wherein the first substrate and the second substrate are disposed opposite to each other to form a non-vacuum sealed cavity, wherein the non-vacuum sealed cavity has a first region and a second region defined therein;
      a capillary structure layer, disposed in the first region and defining a first flow space in the first region;
      a plurality of support structures, disposed in the second region to define a plurality of flow channels and providing support between the first substrate and the second substrate, wherein the plurality of flow channels constitutes a second flow space in the second region; and
      a heat dissipating liquid, disposed in the non-vacuum sealed cavity and configured to flow between the first flow space and the second flow space in the non-vacuum sealed cavity, wherein:

the liquid amount of the heat dissipating liquid is more than 50% of a total capacity of the first flow space and the second flow space, at least a part of the heat dissipating liquid in the first flow space is configured to vaporize into a heat dissipating gas after absorbing heat, the heat dissipating gas is configured to diffuse from an end of the first flow space into the second flow space in the non-vacuum sealed cavity, and, after contacting with the heat dissipating liquid in the second flow space, condense and join the heat dissipating liquid in the second flow space in the non-vacuum sealed cavity, and the heat dissipating liquid after the condensing and the joining is configured to flow in the second flow space and flow back into the first flow space through another end of the first flow space;

wherein the at least one support structure includes a strip glue layer and a waterproof glue layer, the strip glue layer is a double-sided glue layer connected between the first substrate and the second substrate and having an opening, and the opening receives the waterproof glue layer to fixate a position of the waterproof glue layer.

10. The electronic device of claim 9, wherein a thickness of the casing is thinner than 1 mm, wherein the first substrate and the second substrate are disposed substantially parallel and opposite to each other, wherein the first substrate and the second substrate are made of flexible metal material.

11. The electronic device of claim 9, wherein a volume of the heat dissipating liquid in the second flow space is larger than a volume of the heat dissipating gas, wherein the heat dissipating liquid is an insulating liquid with a boiling point lower than 50 degrees Celsius.

12. The electronic device of claim 9, wherein the heat dissipating plate further comprises a sealing glue layer, wherein the sealing glue layer connects the first substrate and the second substrate and surrounds the first region and the second region to form the non-vacuum sealed cavity.

13. The electronic device of claim 9, wherein the capillary structure layer is made of porous material, wherein at least one glue layer attaches the capillary structure layer to at least one of the first substrate and the second substrate.

14. The electronic device of claim 9, wherein the at least one support structure comprises a plurality of support strips spaced apart from each other and disposed in the second region to define the plurality of flow channels.

* * * * *